United States Patent
Marrow et al.

(10) Patent No.: US 10,410,672 B1
(45) Date of Patent: *Sep. 10, 2019

(54) MULTI-STAGE MISO CIRCUIT FOR FAST ADAPTATION

(71) Applicant: Seagate Technology LLC, Cupertino, CA (US)

(72) Inventors: Marcus Marrow, San Jose, CA (US); Jason Bellorado, San Jose, CA (US); Zheng Wu, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/104,933

(22) Filed: Aug. 19, 2018

Related U.S. Application Data

(63) Continuation of application No. 15/723,969, filed on Oct. 3, 2017, now Pat. No. 10,068,608.

(51) Int. Cl.
  *G11B 5/09* (2006.01)
  *G11B 20/10* (2006.01)

(52) U.S. Cl.
  CPC .... *G11B 20/10055* (2013.01); *G11B 20/1024* (2013.01); *G11B 20/10037* (2013.01)

(58) Field of Classification Search
  CPC ..... G11B 20/20; G11B 20/16; G11B 2220/90; G11B 15/087; G11B 27/36; G11B 5/012; G11B 20/10009; G11B 5/09
  USPC ...................... 360/26, 27, 31, 39, 65, 67, 68
  See application file for complete search history.

(56) References Cited

U.S. PATENT DOCUMENTS

| | | | |
|---|---|---|---|
| 5,321,564 A | 6/1994 | Takahashi |
| 5,742,532 A | 4/1998 | Duyne et al. |
| 5,970,093 A | 10/1999 | Lantremange |
| 6,157,510 A | 12/2000 | Schreck et al. |
| 6,320,920 B1 | 11/2001 | Beyke |
| 6,377,552 B1 | 4/2002 | Moran et al. |
| 6,687,073 B1 | 2/2004 | Kupferman |
| 6,697,891 B2 | 2/2004 | Emberty et al. |
| 6,738,215 B2 | 5/2004 | Yatsu |
| 6,950,258 B2 | 9/2005 | Takaishi |

(Continued)

OTHER PUBLICATIONS

Bellorado et al., "Target Parameter Adaptation", Application No. 15334167, Filing Date:Oct. 25, 2016, Seagate Technology LLC.

*Primary Examiner* — Nabil Z Hindi
(74) *Attorney, Agent, or Firm* — Setter Roche LLP; Kirk A. Cesari

(57) ABSTRACT

Systems and methods are disclosed for applying multi-stage multiple input single output (MISO) circuits for fast adaptation. An apparatus may comprise a first reader and a second reader configured to simultaneously read from a single track of a data storage medium, a MISO circuit. The MISO circuit may include a first stage filter having a first number of taps and configured to filter signal samples received from the first reader and the second reader and produce first filtered samples. The MISO circuit may also include a second stage filter having a second number of taps greater than the first number, and be configured to receive the first filtered samples corresponding to the first reader and the second reader from the first filter stage, filter the first filtered samples to produce second filtered samples, and combine the second filtered samples to produce a combined sample output.

20 Claims, 5 Drawing Sheets

(56) References Cited

U.S. PATENT DOCUMENTS

| | | |
|---|---|---|
| 6,993,291 B2 | 1/2006 | Parssinen et al. |
| 7,046,701 B2 | 5/2006 | Mohseni et al. |
| 7,133,233 B1 | 11/2006 | Ray et al. |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,940,667 B1 | 5/2011 | Coady et al. |
| 8,139,301 B1 | 3/2012 | Li et al. |
| 8,172,755 B2 | 5/2012 | Song et al. |
| 8,400,726 B1 | 3/2013 | Wu et al. |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,713,413 B1 | 4/2014 | Bellorado et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,953,276 B1 | 2/2015 | Pokharel et al. |
| 9,007,707 B1 | 4/2015 | Lu et al. |
| 9,064,537 B1 | 6/2015 | Nie et al. |
| 9,082,418 B2 | 7/2015 | Ong et al. |
| 9,099,132 B1 | 8/2015 | Grundvig et al. |
| 9,129,650 B2 | 9/2015 | Mathew et al. |
| 9,196,298 B1 | 11/2015 | Zhang et al. |
| 9,245,579 B2 | 1/2016 | Song et al. |
| 9,245,580 B1 | 1/2016 | Lu et al. |
| 9,257,135 B2 | 2/2016 | Ong et al. |
| 9,311,937 B2 | 4/2016 | Zou et al. |
| 9,401,161 B1 | 7/2016 | Jury et al. |
| 9,424,878 B1 | 8/2016 | Dziak et al. |
| 9,431,052 B2 | 8/2016 | Oberg et al. |
| 9,508,369 B2 | 11/2016 | Chu et al. |
| 9,564,157 B1 | 2/2017 | Trantham |
| 9,590,803 B2 | 3/2017 | Derras et al. |
| 9,672,850 B2 | 6/2017 | Grundvig et al. |
| 9,728,221 B2 | 8/2017 | Oberg et al. |
| 10,068,608 B1 * | 9/2018 | Marrow ............ G11B 5/59633 |
| 2002/0181439 A1 | 12/2002 | Orihashi et al. |
| 2003/0198165 A1 | 10/2003 | Mouri et al. |
| 2010/0290153 A1 | 11/2010 | Hampshire |
| 2011/0090773 A1 | 4/2011 | Yu et al. |
| 2011/0176400 A1 | 7/2011 | Gerasimov |
| 2012/0155577 A1 | 6/2012 | Shukla et al. |
| 2017/0249206 A1 | 8/2017 | Jeong et al. |

* cited by examiner

MULTI-STAGE MISO CIRCUIT FOR FAST ADAPTATION

CROSS-REFERENCE TO RELATED APPLICATION

The present application is a non-provisional application of and claims priority to pending U.S. non-provisional patent application, application Ser. No. 15/723,969, filed on Oct. 3, 2017, entitled "MULTI-STAGE MISO CIRCUIT FOR FAST ADAPTATION" which claims priority to provisional patent application, Application No. 62/522,248, filed Jun. 20, 2017, entitled "MISO Systems and Methods", the contents of which are hereby incorporated by reference in their entirety.

SUMMARY

In certain embodiments, an apparatus may comprise a first reader and a second reader configured to simultaneously read from a single track of a data storage medium, a multiple input, single output (MISO) circuit, and a detector. The MISO circuit may include a first stage filter having a first number of taps and configured to filter signal samples received from the first reader and the second reader and produce first filtered samples. The MISO circuit may also include a second stage filter having a second number of taps greater than the first number, and be configured to receive the first filtered samples corresponding to the first reader and the second reader from the first filter stage, filter the first filtered samples to produce second filtered samples, and combine the second filtered samples to produce a combined sample output. The detector may be configured to detect a bit pattern based on the combined sample output.

In certain embodiments, an apparatus may comprise a read/write (R/W) channel including a first reader and a second reader configured to simultaneously read from a single track of a data storage medium, and a multiple input, single output (MISO) circuit. The MISO circuit may include a first stage filter having a first number of taps and configured to filter signal samples received from the first reader and the second reader and produce first filtered samples. The MISO circuit may also include a second stage filter having a second number of taps greater than the first number, and configured to receive the first filtered samples corresponding to the first reader and the second reader from the first filter stage, filter the first filtered samples to produce second filtered samples, and combine the second filtered samples to produce a combined sample output.

In certain embodiments, an apparatus may comprise a first reader and a second reader configured to simultaneously read from a single track of a data storage medium, and a multiple input, single output (MISO) circuit. The MISO circuit may include a first stage filter and a second stage filter. The first stage filter may be configured to filter signal samples received from the first reader and the second reader and produce first filtered samples, apply a first adaptation step size for a first selected number of samples of the signal samples from a new data sector to rapidly adjust to changes in positioning of the first reader and the second reader relative to the single track, and apply a second adaptation step size smaller than the first adaptation step size after the first selected number of samples for fine-grain adjustment when the first reader and the second reader are in a steady state relative to the single track. The second stage filter may be configured to receive the first filtered samples corresponding to the first reader and the second reader from the first filter stage, filter the first filtered samples to produce second filtered samples, and combine the second filtered samples to produce a combined sample output.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
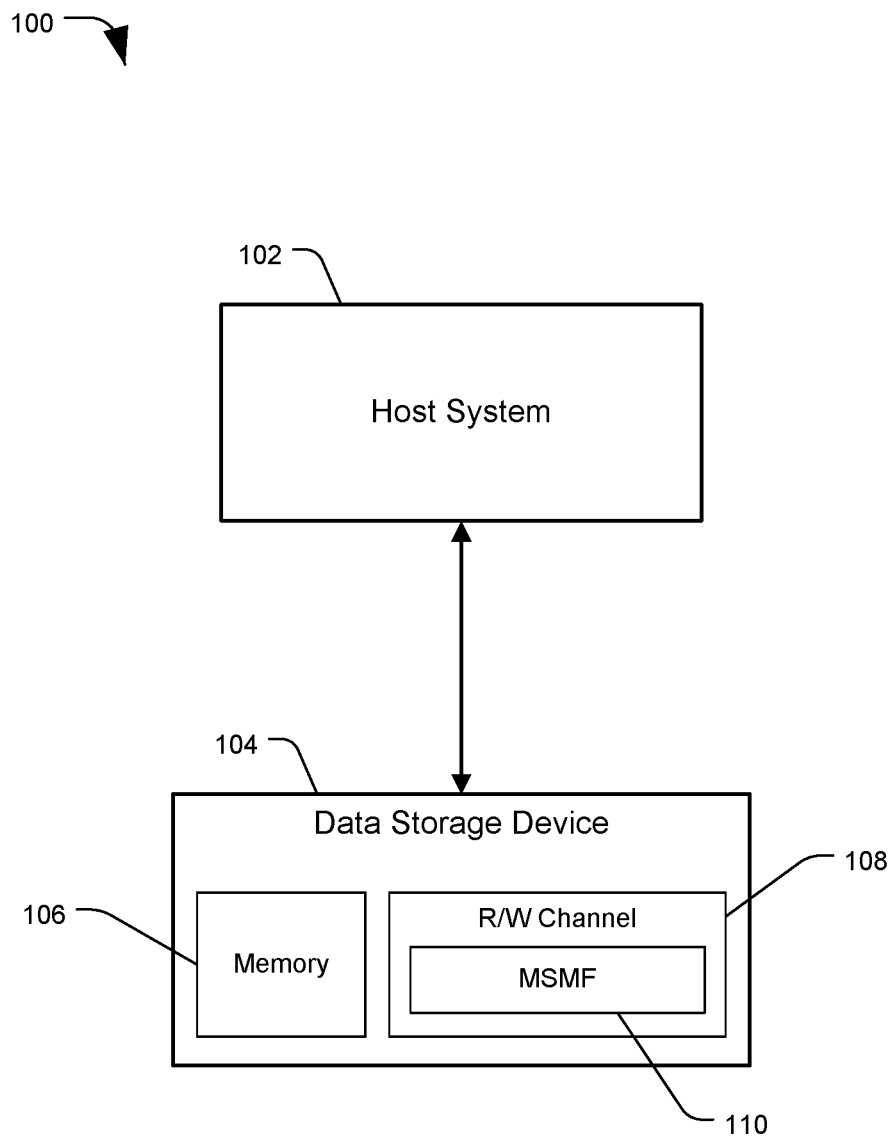
FIG. 1 is a diagram of a system including a multi-stage multiple input single output (MISO) circuit for fast adaptation, in accordance with certain embodiments of the present disclosure.

FIG. 1 is a diagram of a system, generally designated 100, including a multi-stage multiple input single output (MISO) circuit for fast adaptation, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a hard disc drive (HDD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a read/write (R/W) channel 108. During operation, the DSD 104 may receive a data access request, such as a read or write request, from the host device 102. In response, the DSD 104 may perform data access operations on the memory 106 via the R/W channel 108 based on the request.

The R/W channel 108 may comprise one or more circuits or processors configured to process signals for recording to or reading from the memory 106. The memory 106 may include a magnetic storage medium such as a hard disc, which may have data stored to concentric or spiral data tracks on the surface of the media. The tracks may be divided into zones, with each zone having a set of contiguous data tracks (e.g. an inner zone closest to the inner diameter (ID) or center of the disc, a middle zone, and an outer zone closest to the outer diameter (OD) or outer edge of the disc). Data can be stored to the tracks via setting localized polarity of magnetic fields on the surface of the disc. The magnetic fields may be detected by a reader element, sometimes called a read head, and the reader may generate a signal in the form of an analog waveform based on the detected magnetic fields. The R/W channel can receive and process the signal to obtain data, for example in the form of a sequence of bits. Similarly, digital data can be processed by the R/W channel 108 and converted into a signal that can be stored to the memory 106 via a writer or write head, by generating a magnetic field based on the signal. In some embodiments, the reader and writer elements may be referred to collectively as transducers or the "head(s)" of a data storage system. The heads may be located on a movable actuator arm that can position the heads over a desired location on the media. As the media spins, data can be read from or recorded to one or more tracks using the heads.

The DSD 104 may be a multi-sensor magnetic recording (MSMR) system, which may use multiple reader elements over a single storage media surface to sense the magnetic field from the same track of the media simultaneously during a read operation. Each of the N readers may produce a sample stream from a unique analog front end (AFE), which provide gain, filtering and sampling functions. When these N sample streams are correctly combined in the R/W channel 108, the multi-reader system can provide signal to noise ratio (SNR) and bit error rate (BER) gains over a single reader system. The multiple streams can combined using a multi-stage MISO filter (MSMF) 110, located within the R/W channel 108, a data storage controller, or elsewhere in the DSD 104. The MSMF 110 may perform the methods and processes described herein to quickly adapt to changes in the sample streams, filter the streams, and combine them as described herein. An example arrangement of reader elements in an MSMR system is described in regard to FIG. 2.

Figure 2:
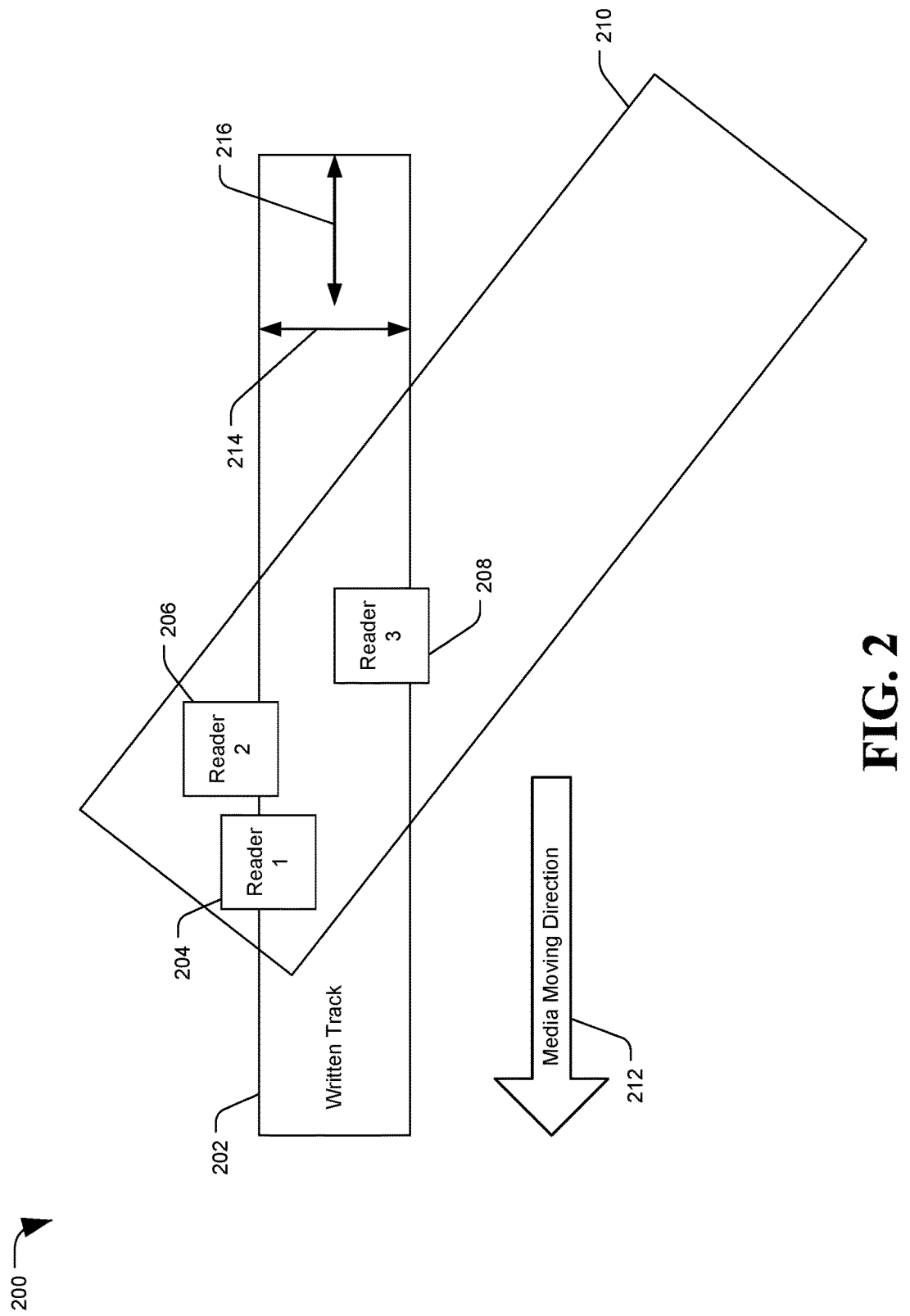
FIG. 2 is a diagram of a system including a multi-stage MISO circuit for fast adaptation, in accordance with certain embodiments of the present disclosure.

FIG. 2 is a diagram of a system, generally designated 200, including a multi-stage MISO circuit for fast adaptation, in accordance with certain embodiments of the present disclosure. The system 200 can include a written data track 202 from a storage medium, such as a hard disc. The track 202 may have data recorded thereto by means of polarized magnetic fields along the track. In an MSMR system, a DSD may have a plurality (e.g. an integer "N") of analog waveforms produced from the track 202 by a plurality ("N") read heads, such as reader 1 204, reader 2 206, and reader 3 208. Although three heads are depicted, more or fewer heads may also be used. The heads can each have a cross-track 214 and down-track 216 position, and may be offset from each other in a cross-track and down-track direction. Reader 1 204, reader 2 206, and reader 3 208 may be connected to an adjustable arm 210, which can position the readers over a desired track. The cross-track 214 and down-track 216 positioning and offset of each head may change from zone to zone or track to track, depending on the angle of the arm 210 relative to the media. The down-track 216 offsets between the readers may translate to a delay between readers for a given signal pattern from the track. The cross-track 214 positions of the readers may influence a relative signal strength or reliability of a given reader in reading the recorded signal. For example, a head that is more centered over the track 202 may provide a more accurate reproduction of the recorded signal than a head that is mostly off-track.

The arm 210 can position the heads over a desired track 202, and the track moves as the disc media spins, allowing the heads to read data from the entire track. The disc media may be spinning in the direction indicated by the arrow 212. In this example, reader 3 208 would be the leading head (e.g. the first head to read a specific location on the track), followed by reader 2 206, and then reader 1 204 would be the trailing head.

As stated, although the heads may be very close to each other on the arm 210, they may still be separated across the track 214 as well as down the track 216. For correct combining, the R/W channel may use delay elements to align the samples streams in time to account for reader down-track 216 offsets. Additional SNR & BER gains can be achieved with correct weighting of the streams (e.g. not straight averaging, but applying a higher weight to superior or more reliable sample streams). In particular, weighting can include using spectral weighting where the signals are filtered (to emphasize or de-emphasize particular frequency bands) prior to combining, which frequency bands can account for the signal and noise statistic differences arising from cross-track 214 offsets.

This type of signal processing scheme, in which multiple sample streams are individually weighted and combined, may be referred to as multi-input, single output (MISO) processing. The MISO processing can be performed using MISO circuits or filters, which may be configured to receive N input streams, performing weighting and filtering of the streams, and then combine the N filtered streams to produce a single combined output stream. An example of a R/W channel including a MISO circuit is described in regard to FIG. 3.

Figure 3:
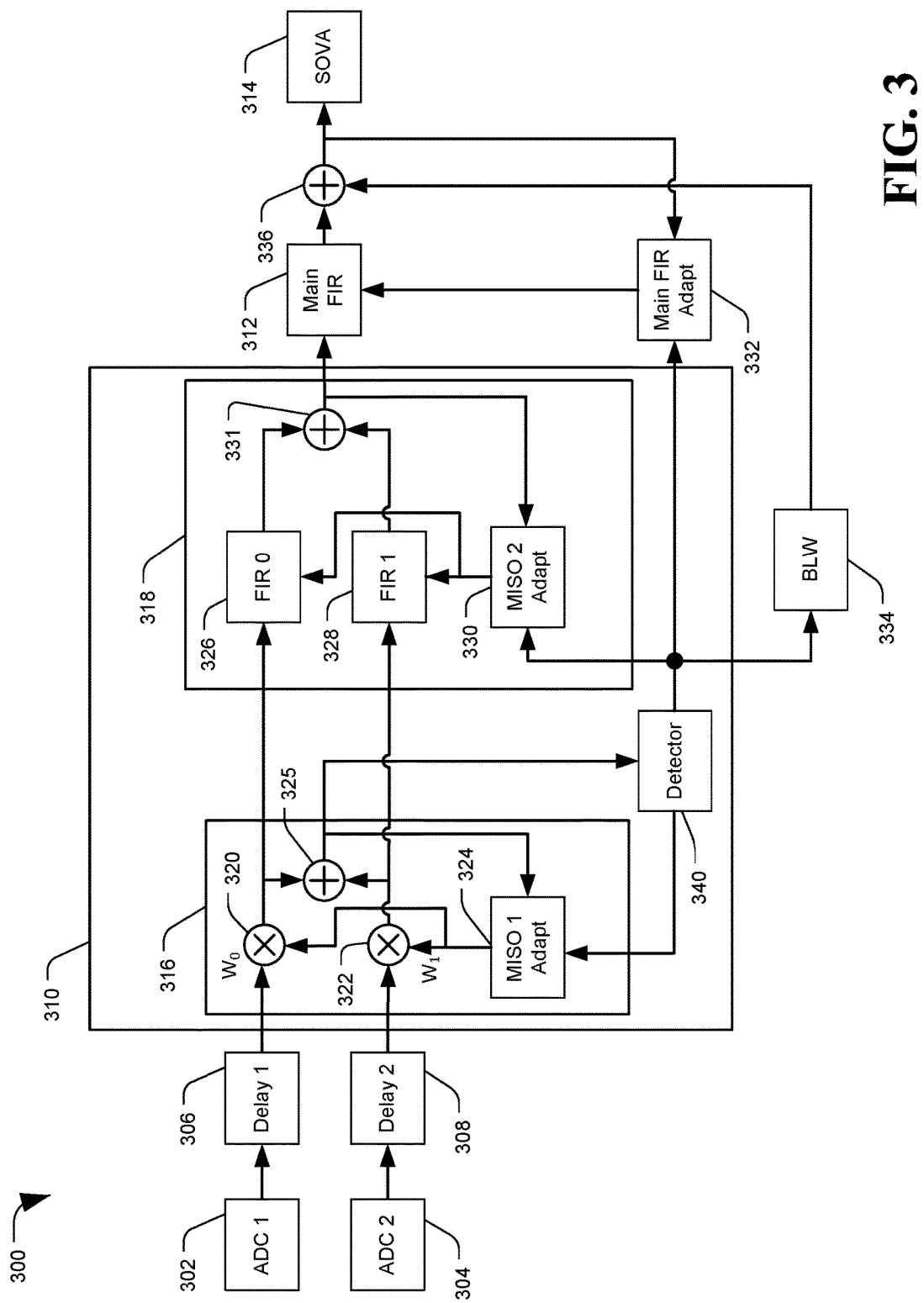
FIG. 3 is a diagram of a system including a multi-stage MISO circuit for fast adaptation, in accordance with certain embodiments of the present disclosure.

FIG. 3 is a diagram of a system, generally designated 300, including a multi-stage MISO circuit for fast adaptation, in accordance with certain embodiments of the present disclosure. The system 300 may all be included within a R/W channel, such as the R/W channel 108 of FIG. 1. The depicted system 300 may be part of an example MSMR system having two reader elements configured to read data from the same track.

The system 300 may include two data paths corresponding to the two reader elements (not shown). A first reader may provide an analog signal to an analog to digital converter (ADC) 1 302, which may produce digital sample values (e.g. a sample stream) which are provided to a delay 1 circuit 306. Likewise, a second reader may provide a signal to ADC 2 304, which may provide a sample stream to delay 2 308. Delay 1 306 and delay 2 308 may be configured to delay the sample values based on a down-track offset between the readers, so that the samples will be aligned relative to the same portion of the data track.

The aligned sample streams from delay 1 306 and delay 2 308 may be provided to a multi-stage MISO filter (MSMF) circuit 310, which may filter and then combine the two sample streams into a combined sample stream. The combined sample stream may be passed to a main finite impulse response (FIR) filter 312, which may perform whitening of the sample values and provide them to a soft output Viterbi algorithm (SOVA) detector 314. The SOVA detector 314 may determine a sequence of data bits based on the filtered combined sample output.

In addition to the main FIR 312, the multi-stage MISO filter 310 may also include FIR filters. FIR filters may operate by outputting a value that is a weighted sum of the most recent input values. For example, an FIR may perform an equation including:

$$y[n] = \Sigma_{i=0}^{N} b_i * x[n-i]$$

$$= b_0 x[n] + b_1 x[n-1] + \ldots + b_N x[n-N], \quad \text{Equation 1:}$$

where y[n] is the output signal, x[n] is the input signal value, and $b_i$ is the coefficient or weight applied to the corresponding input signal value. N may refer to the order of the FIR; an Nth-order FIR filter may consider the N+1 most recent input values x[n−i], and that number N+1 may be referred to as the number of "taps" of the FIR. For example, an FIR that considers the 6 most recent input values may be referred to as a $5^{th}$ order or 6-tap FIR. A filter that only considers a single input value and applied a corresponding coefficient or weight b may be a $0^{th}$ order or 1-tap filter. The more taps, the "longer" the filter may be considered. For example, less than four taps may be considered a "short" filter, while more than seven taps may be considered a "long" filter, depending on the application, data rate, etc.

One factor to be considered regarding signal filters may be the speed with which a filter adapts to changes in the signal (e.g. caused by a change in a reader's position relative to the target track). Filters may "adapt" by using adaptation algorithms or filters to adjust the coefficients applied by the FIRs to received sample values. For example, a least mean square (LMS) adaptation filter circuit may receive the output of an FIR and use a squared error cost function to compute adaptations to apply to the FIR filter coefficients. An adaptation filter may include large accumulators (e.g. 20 bits wide), of which the top bits may be used as the coefficients $b_i$ by the FIR filter, thereby adapting the parameters of the FIR.

When a reader or set of readers strays from the center of a track, it may be called a 'transient' event, to which the R/W channel should adapt for continued reliable signal processing and realignment of the heads. It may be advantageous for the R/W channel to adapt quickly in order to avoid read failures or the need for extensive error correction. Longer MISO filters may provide additional SNR and BER gains relative to shorter MISO filters; however, the gains may come at the expense of adaptation speed.

The adaptation rate of a MISO system may generally be significantly poorer than that of a single reader system, as it may be, in general, ill-conditioned, particularly where the cross-track separation of the readers is small and hence the input waveforms and corresponding sampled data stream may be quite similar when aligned. This ill-conditioning may be due to the set of adapting coefficients at the adaptation filter having directions which do not result in a large change in the squared error cost function, and may be measured through eigenvalue spread. For example, for an 11-tap FIR, its direction in the 11-dimensional space may be represented by the values of its coefficients, [−1, −1, 1, 1, 1, 1, 1, 1]. However, a number of techniques may be used to improve the adaptation rate of a MISO system, without impacting steady-state performance (e.g. when the readers are properly positioned over the target track without significant transient effects).

Accordingly, the MSMF 310 may be an equalizer configured for fast adaptation and transient handling, while maintaining high steady-state performance. The MSMF 310 may be a multi-stage equalizer, having a first stage filter 316 and a second stage filter 318. The first stage 316 may be designed for optimum transient response, and the second stage 318 may be designed for optimum steady-state performance. The first stage 316 may comprise of a short FIR (e.g. less than four taps, or simple weighting using a 1-tap filter). The second stage 318 may comprise a longer filter with slower adaptation (e.g. greater than seven taps). Under transient conditions, such as reading off-track (e.g. the read heads are not centered cross-track as they were during training), the first stage 316 can quickly respond to the channel change, adapting rapidly due to the low number of taps and settling the sample stream before the second, ill-conditioned, stage 318 reacts to the condition.

In the example system 300, the first stage 316 may comprise the adaptive weights $W_0$ 320 and $W_1$ 322, to filter the sample streams from delay 1 306 and delay 2 308, respectively. The weights $W_0$ 320 and $W_1$ 322 may be adaptively adjusted based on the MISO 1 adaption filter 324, for example based on a combined sample stream from an adder 325, configured to combine the weighted sample values from $W_0$ 320 and $W_1$ 322. While the adaptive weights $W_0$ 320 and $W_1$ 322 could instead be longer filters, the adaption speed would be reduced accordingly, and furthermore, phase constraints may have to be imposed if the timing recovery system of the R/W channel uses the outputs of those filters.

The non-combined weighted outputs of the first stage 316 may provide the inputs to the second stage MISO 318, which may comprise FIR 0 326, FIR 1 328 and their associated MISO 2 adaptive circuit 330. FIR 0 326 and FIR 1 328 may be longer filters than those of the first stage 316; e.g. 11-tap filters. The filters may also be programmable, so as to employ a selected number of available tap lengths (e.g. from 11 to 4 taps), improving dynamics at the expense of granularity of spectral weighting. As with the first stage filter 316, the sample streams filtered by FIR 0 326 and FIR 1 328 may be combined at an adder 331. The output of the adder 331 may be used by the MISO 2 adaptive filter to adjust the coefficients applied by FIR 0 326 and FIR 1 328. The combined sample stream from the adder 331 may also be the output of the MSMF 310 that is provided to the main FIR 312.

A further benefit of the multistage architecture of the MSMF 310 is that a low latency combined signal is available from the first stage 316 to drive a loop detector 340 to generate early decisions for the read-channel loops (e.g. gain, offset, timing & multiresolution analysis (MRA) loops, not shown). The decisions produced by the loop detector 340 may also be used as input to the adaptation filters configured to adjust the FIRs of the system 300, such as the MISO 1 adaptation filter 324, the MISO 2 adaptation filter 330, and a main FIR adaptation filter 332, which may adjust the parameters of the main FIR 312. The output of the loop detector 340 may also be provided to a baseline wander (BLW) correction module 334. BLW may be an artifact in signal processing where the base axis of the signal appears to "wander", or move up and down, rather than remain straight. The BLW module 334 can use the decisions of the loop filter 340 and apply an equation like a decaying exponential. The output of the BLW module 334 may be subtracted from the output of the main FIR 312 at adder 336 to reduce or eliminate the effects of BLW from the filtered sample stream provided to the SOVA 314.

As described above, the main FIR 312 may provide a third stage of equalization, after the first stage filter 316 and the second stage filter 318. The main FIR equalizer 312 may operate on the combined signal from the second stage filter 318, and may be included within or separate from the MSMF 310, or excluded from the system 300 entirely. A benefit of this 3rd stage main FIR 312 is that earlier stages can equalize to a symmetric target which can reduce the equalization burden on those filters. The final 3rd stage can perform phase equalization to a minimum phase target (e.g. a monic target, controlled by the main FIR adaptation filter 332). The minimum phase target may be preferred as when it is used, the corresponding main FIR 312 tends to whiten the noise samples, improving the adaptation characteristics of the down-stream SOVA 314.

A monic target may involve using a main large coefficient, with all the other coefficients adapting after the main coefficient. The monic target tries to move all the energy to the front, called the minimum phase. Then the Main FIR 312 becomes a whitener that gives a better statistic to the SOVA 314. For the earlier filters, such as the first stage 316 and the second stage 318, fast adaptation may be more important than whitening. So other targets (e.g. MISO 1 adaptation filter 324 and MISO 2 adaptation filter 330) may be symmetric rather than minimum phase, with no phase equalization. Therefore the targets for the first stage 316 and the second stage 318 may be configured to performing weighting based on SNR.

Additionally, the first stage filter 316, the second stage filter 318, or both may be configured with variable adaptation rate support (termed gearing). Gearing may be implemented in the MISO 1 adaptation filter 324, the MISO 2 adaptation filter 330, or both.

With gearing, for a first (e.g. programmable or selectable) period, a large least mean square (LMS) step size may be used, which may result in fast adaptation of the FIR filters. The period of this "high gear" fast adaptation setting may be based on a number of clock cycles or samples after a sector sync mark is found (e.g. at the beginning of a sector), a number of bits of a data sector, a number of bits after a servo sector, or some other period. According to some embodiments, there may be a 1:1 correlation between samples and bits on the media, and one sample may be taken per clock cycle, and so periods may be interchangeably measured in samples, bits, or clock cycles. A tradeoff with fast adaptation, however, may be that the steady state performance can be degraded as the filter weights move by large increments in response to signal noise. To mitigate the steady state error, the gearing can switch to a slower adaptation rate with a small LMS step size (e.g. low gear) for the remainder of the sector. For example, the adaption filters may have step sizes for each adaptation loop that ranges from 1 to 7, in powers of two in terms of weight of the error. In such an example implementation, a "high gear" fast adaptation value may be in the range of 5 to 7, while a "low gear" steady state adaptation value may be in the range of 1 to 3.

Accordingly, if a transient event is occurring at the start of a sector, the MSMF 310 can adapt quickly in "high gear" while the positioning of the readers is corrected, and then switch to "low gear" for reading in the steady state. In an event where the readers are properly positioned over the track when a sector starts, the initial high gear setting may result in a slightly "noisy" signal for the first period, but the high gear setting should not significantly impact R/W channel performance. The impact of gearing can be seen in regard to the diagrams of FIGS. 4A and 4B.

Figure 4A:
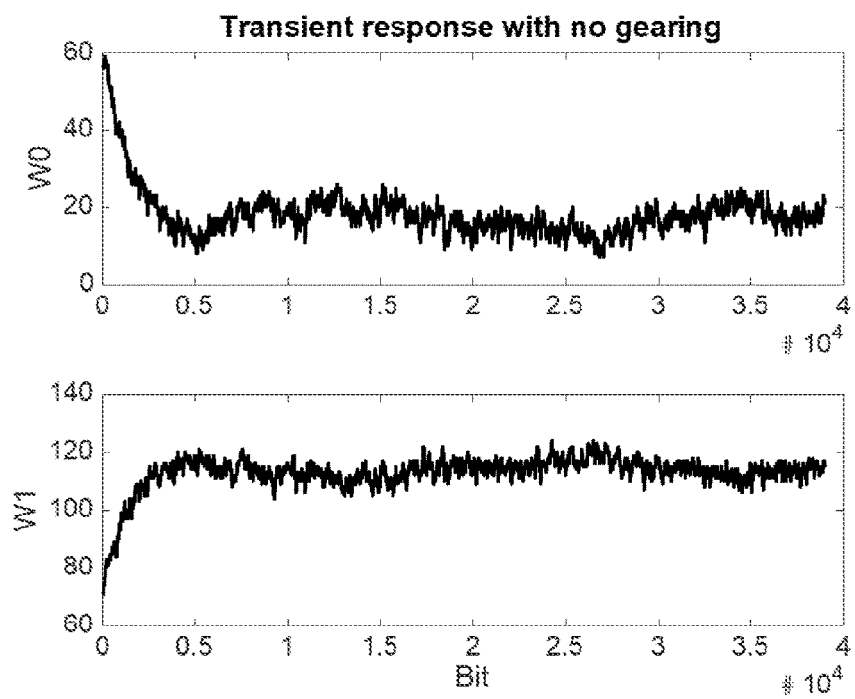
FIGS. 4A and 4B are graphs of simulation results for a system including a multi-stage MISO circuit for fast adaptation, in accordance with certain embodiments of the present disclosure.
Figure 4B:
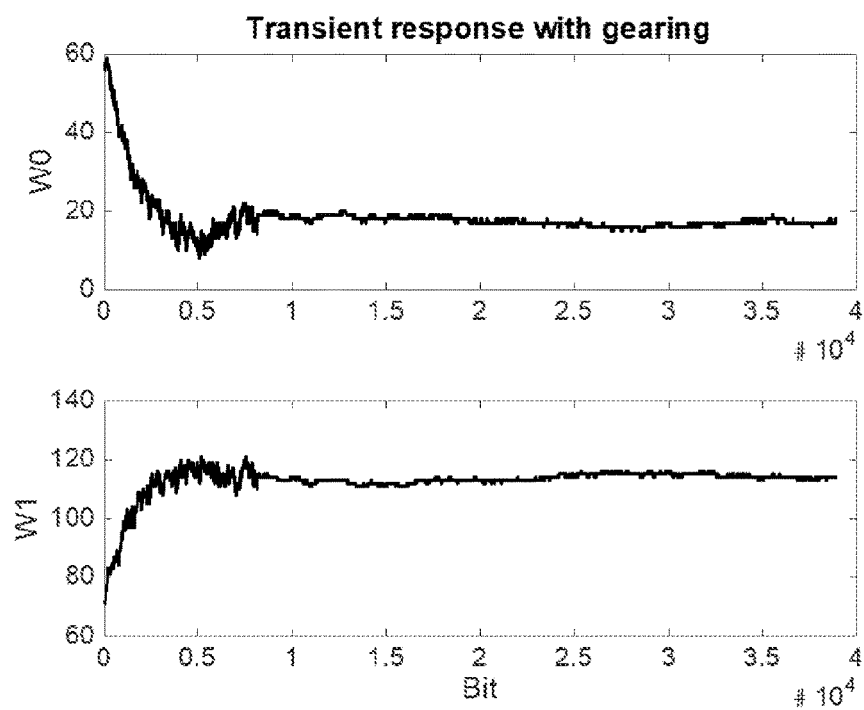

FIGS. 4A and 4B are graphs of simulation results for a system including a multi-stage MISO circuit for fast adaptation, in accordance with certain embodiments of the present disclosure. In particular, FIGS. 4A and 4B depict the weighted outputs from $W_0$ and $W_1$ of the first stage filter 316 of FIG. 3 at the beginning of a data sector during a transient event, when the readers are off-center from the track. FIG. 4A depicts the transient response with no gearing active, while FIG. 4B depicts the transient response with gearing enabled.

As described, FIGS. 4A and 4B depict the filter response when a new sector begins that's off-track. FIG. 4A depicts results from a system in which the first stage filters are applying a "high gear" fast adaptation step size, such as a 7, which allows the filters to quickly adapt to the transient event (e.g. within the first 500 bits). However, once a steady state is reached, the output may contain a large amount of noise as large step sizes are used to adjust the filter coefficient weights up and down. If a smaller step size was used instead of a "high gear" step size, there would be less noise in the steady state, but the filter would take much longer to adapt to the transient event.

In the system of FIG. 4B, a "high gear" step size (e.g. 7, as in FIG. 4A) may be used for the first selected number of bits (e.g. 500), allowing the first stage filter to quickly adapt to the transient event. However, in FIG. 4B, the gearing weighting trajectories correspond to reducing the LMS step-size by a factor of, e.g. 8 after 500 bits. The smaller step size reduces the amount of noise of the first stage filter output relative to the system of FIG. 4A once a steady state is reached. The gearing allows the system of FIG. 4B to adapt quickly to the transient event, while still providing low-noise steady state output.

In both FIG. 4A and FIG. 4B, it can be seen that using first stage filters with 1-tap weights allows the filters to react to the transient within approximately 500 clock cycles when using fast adaptation step sizes (e.g. approximately $\frac{1}{8}^{th}$ of a single sector), whereas it may take an 11-tap FIR many sectors to respond to this same transient. The adaptation may be fast enough that downstream FIRs in the R/W channel should not be impacted by the transient event. The downstream FIRs, such as the second-stage filter, may only have to respond to spectral changes in the signal and not gross weighting changes.

The values depicted in FIGS. 4A and 4B would then be sent from the first stage filter to the second stage FIR filters of the MSMF, such as FIR 0 326 and FIR 1 328 of FIG. 3. The second stage filters may be much longer filters than those of the first stage, such as 11-tap filters. Due to the off-center readers, FIR 0 326 may have its input dropped very low, while FIR 1 328 may have its input greatly increased.

This may be acceptable because the adaptation filters or "targets" for the first stage filters and the second stage filters (e.g. MISO 1 adapt 324 and MISO 2 adapt 330 of FIG. 3, respectively) may be the same or very similar. In an example embodiment, the targets may both be 7-tap symmetric filters applying the same cost function. Because of that, the second stage filters would adapt to transient events in the same way as the first stage filters, but do it much more slowly because the second-stage filters may be 11-tap filters as opposed to 1-tap weights. Adapting to the transient of depicted in FIGS. 4A and 4B with the second stage filters alone, without the multi-stage MISO configuration, may include taking every coefficient of FIR 0 326 and gradually dropping them all down, and taking every coefficient of FIR 1 328 and gradually raising them all up. However, this process may be very slow compared to the adaptation shown in FIGS. 4A and 4B, because the second stage filter with 11-tap FIRs may be a 22-dimensional system and not a 2-dimensional system, as with the first-stage filter with 1-tap weights.

As can be seen from FIG. 4B, the combination of single weight adaptation and gearing in the first stage filter of the MISO circuit can fully react to an incoming signal transient in a much shorter period than the reaction time of the longer second stage filter of the MISO circuit. Fully adapting at the first stage can reduce the adaptation requirements of the second stage filter to that of fine grain spectral weighting, which, in general, may require less coefficient movement than the gross weighting changes shown in FIG. 4B.

Figure 5:
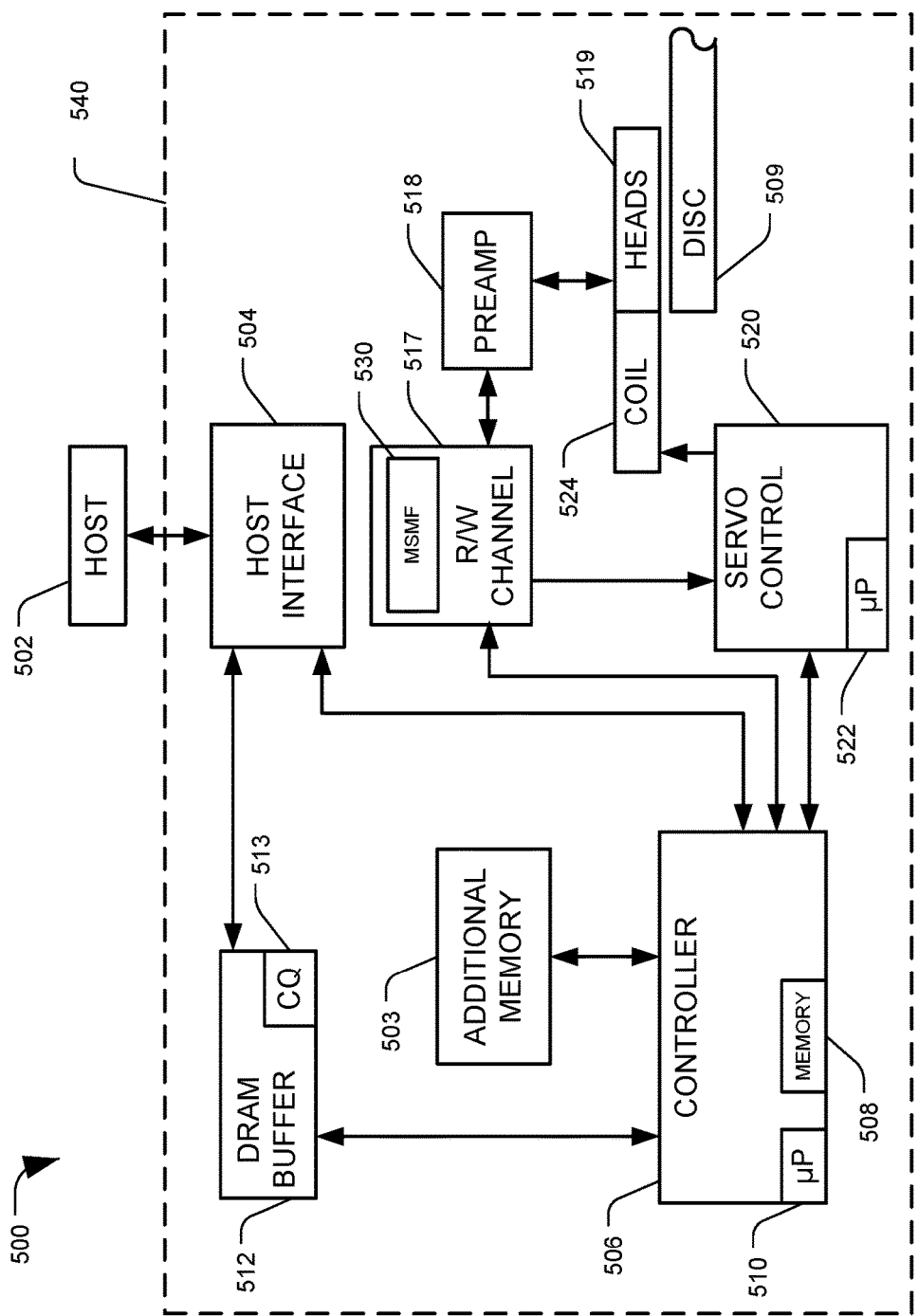
FIG. 5 is a diagram of a system including a multi-stage MISO circuit for fast adaptation, in accordance with certain embodiments of the present disclosure.

Turning now to FIG. 5, a diagram of a system, generally designated 500, including a multi-stage MISO circuit for fast adaptation is shown, in accordance with certain embodiments of the present disclosure. Specifically, FIG. 5 provides a functional block diagram of an example data storage device (DSD) 500, which may be an embodiment of the data storage device 104 of FIG. 1. The DSD 500 can communicate with a host device 502 (such as the host system 102 shown in FIG. 1) via a hardware or firmware-based interface circuit 504. The interface 504 may comprise any interface that allows communication between a host 502 and a DSD 500, either wired or wireless, such as USB, IEEE 1394, Compact Flash, SATA, eSATA, PATA, SCSI, SAS, PCIe, Fibre Channel, Ethernet, or Thunderbolt, among others. The interface 504 may include a connector (not shown) that allows the DSD 500 to be physically removed from the host 502. The DSD 500 may have a casing 540 housing the components of the DSD 500, or the components of the DSD 500 may be attached to the housing, or a combination thereof. The DSD 500 may communicate with the host 502 through the interface 504 over wired or wireless communication.

The buffer 512 can temporarily store data during read and write operations, and can include a command queue (CQ) 513 where multiple pending operations can be temporarily stored pending execution. Commands arriving over the interface 504 may automatically be received in the CQ 513 or may be stored there by controller 506, interface 504, or another component.

The DSD 500 can include a programmable controller 506, which can include associated memory 508 and processor 510. The controller 506 may control data access operations, such as reads and writes, to one or more disc memories 509. The DSD 500 may include an additional memory 503 instead of or in addition to disc memory 509. For example, additional memory 503 can be a solid state memory, which can be either volatile memory such as DRAM or SRAM, or non-volatile memory, such as NAND Flash memory. The additional memory 503 can function as a cache and store recently or frequently read or written data, or data likely to be read soon. Additional memory 503 may also function as main storage instead of or in addition to disc(s) 509. A DSD 500 containing multiple types of nonvolatile storage mediums, such as a disc(s) 509 and Flash 503, may be referred to as a hybrid storage device.

The DSD 500 can include a read-write (R/W) channel 517, which can encode data during write operations and reconstruct user data retrieved from a memory, such as disc(s) 509, during read operations. A preamplifier circuit (preamp) 518 can apply write currents to the heads 519 and provides pre-amplification of read-back signals. In some embodiments, the preamp 518 and heads 519 may be considered part of the R/W channel 517. A servo control circuit 520 may use servo data to provide the appropriate current to the coil 524, sometimes called a voice coil motor (VCM), to position the heads 519 over a desired area of the disc(s) 509. The controller 506 can communicate with a processor 522 to move the heads 519 to the desired locations on the disc(s) 509 during execution of various pending I/O commands in the command queue 513.

DSD 500 may include a multi stage MISO filter (MSMF) 530, for example in the R/W channel 517, the controller 506, distributed among multiple components, as one or more stand-alone circuits, or any combination thereof. The MSMF 530 may perform the methods and processes described herein to quickly adapt to signal changes and head 519 off-track transient events, while providing high quality steady-state performance.

Although the foregoing examples provided herein are directed to R/W channels in an MSMR data storage device, the teachings are not limited thereto and can be applied to any multi-receiver data processing channel, such as a system with multiple wireless signal antennae and a wireless signal processing channel. Furthermore, components can be added, rearranged, or removed without departing from the scope of the present disclosure. For example, the main FIR 312 of FIG. 3 and its associated adaptation filter 332, the BLW 334, or any combination thereof, may be incorporated into the MSMF 310, be disposed between the MSMF 310 and downstream R/W channel components, or removed from the system entirely.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a multiple input, single output (MISO) circuit configured to:
   receive signal samples from a first receiver and a second receiver configured to simultaneously read from a single track of a data storage medium;

filter the signal samples to produce a filtered sample output, including:
apply a first adaptation step size for a first selected number of samples of the signal samples from a new data sector to rapidly adjust to changes in positioning of the first receiver and the second receiver relative to the single track; and
apply a second adaptation step size smaller than the first adaptation step size after the first selected number of samples to perform fine-grain adjustment when the first receiver and the second receiver are in a steady state relative to the single track.

2. The apparatus of claim 1 further comprising:
the MISO circuit includes:
a first stage filter configured to:
receive the signal samples, including first signal samples from the first receiver and second signal samples from the second receiver;
perform coarse, rapid adaptation to changes in the first signal samples and the second signal samples;
produce first filtered samples corresponding to the first signal samples and second filtered samples corresponding to the second signal samples;
a second stage filter configured to:
receive the first filtered samples and the second filtered samples;
perform fine-grain, slow adaptation to changes in the first filtered samples and the second filtered samples;
produce third filtered samples corresponding to the first filtered samples;
produce fourth filtered samples corresponding to the second filtered samples; and
combine the third filtered samples and the fourth filtered samples to produce the filtered sample output.

3. The apparatus of claim 2 further comprising:
the first stage filter is configured to apply the first adaptation step size and the second adaptation step size.

4. The apparatus of claim 3 further comprising:
the second stage filter further configured to:
apply a third adaptation step size for the first selected number of samples of the signal samples from the new data sector; and
apply a fourth adaptation step size smaller than the third adaptation step size after the first selected number of samples.

5. The apparatus of claim 2 further comprising:
the second stage filter is configured to apply the first adaptation step size and the second adaptation step size.

6. The apparatus of claim 2 further comprising:
the first stage filter further configured to combine the first filtered samples and the second filtered samples to produce a combined first filter output;
a first stage detector configured to determine a sequence of bits based on the combined first filter output; and
the first stage filter having respective first filter coefficient values applied to samples corresponding to the first receiver and the second receiver that are adaptive based on the sequence of bits.

7. The apparatus of claim 6 further comprising the second stage filter having second filter coefficient values that are adaptive based on the sequence of bits.

8. The apparatus of claim 2 further comprising:
the first stage filter has a first number of taps, wherein taps correspond to a number of sample input values considered in adapting to changes in a sample stream; and
the second stage filter has a second number taps greater than the first number of taps.

9. The apparatus of claim 8 further comprising the first number of taps being a single tap, the first stage filter configured to apply separately selectable weighting values to the first signal samples and the second signal samples.

10. An apparatus comprising:
a multiple input, single output (MISO) circuit configured to condition samples from a signal pattern for data detection, including:
a first stage filter configured to:
receive first signal samples from a first receiver and second signal samples from a second receiver, the first receiver and the second receiver configured to simultaneously receive the signal pattern;
perform coarse, rapid adaptation to changes in the first signal samples and the second signal samples;
produce first filtered samples corresponding to the first signal samples and second filtered samples corresponding to the second signal samples;
a second stage filter configured to:
receive the first filtered samples and the second filtered samples;
perform fine-grain, slow adaptation to changes in the first filtered samples and the second filtered samples;
produce third filtered samples corresponding to the first filtered samples;
produce fourth filtered samples corresponding to the second filtered samples; and
combine the third filtered samples and the fourth filtered samples to produce a combined sample output.

11. The apparatus of claim 10 further comprising:
the first receiver and the second receiver are configured to simultaneously read the signal pattern from a single track of a data storage medium;
the MISO circuit configured to:
apply a first adaptation step size for a first selected number of samples of the signal pattern from a new data sector to rapidly adjust to changes in positioning of the first receiver and the second receiver relative to the single track; and
apply a second adaptation step size smaller than the first adaptation step size after the first selected number of samples to perform fine-grain adjustment when the first receiver and the second receiver are in a steady state relative to the single track.

12. The apparatus of claim 11 further comprising:
the first stage filter is configured to apply the first adaptation step size and the second adaptation step size.

13. The apparatus of claim 12 further comprising:
the second stage filter is configured to:
apply a third adaptation step size for the first selected number of samples of the signal pattern from the new data sector; and
apply a fourth adaptation step size smaller than the third adaptation step size after the first selected number of samples.

14. The apparatus of claim 11 further comprising:
the second stage filter is configured to apply the first adaptation step size and the second adaptation step size.

15. The apparatus of claim 10 further comprising:
the first stage filter further configured to combine the first filtered samples and the second filtered samples to produce a combined first filter output;
a first stage detector configured to determine a sequence of bits based on the combined first filter output;
the first stage filter configured to adapt first coefficient values applied to the first signal samples and the second signal samples based on the sequence of bits; and
the second stage filter configured to adapt second coefficient values applied to the first filtered samples and the second filtered samples based on the sequence of bits.

16. The apparatus of claim 10 further comprising:
the first stage filter has a first number of taps, wherein taps correspond to a number of sample input values considered in adapting to changes in a sample stream; and
the second stage filter has a second number taps greater than the first number of taps.

17. A method comprising:
receiving, at a multiple input, single output (MISO) circuit configured to condition samples from a signal pattern for data detection, signal samples from a first receiver and a second receiver configured to simultaneously read from a single track of a data storage medium;
filtering, at the MISO circuit, the signal samples to produce a filtered sample output, including:
applying a first adaptation step size for a first selected number of samples of the signal samples from a new data sector to rapidly adjust to changes in positioning of the first receiver and the second receiver relative to the single track; and
applying a second adaptation step size smaller than the first adaptation step size after the first selected number of samples to perform fine-grain adjustment when the first receiver and the second receiver are in a steady state relative to the single track.

18. The method of claim 17 further comprising:
performing first stage filtering at a first stage filter of the MISO circuit, including:
receiving the signal samples, including first signal samples from the first receiver and second signal samples from the second receiver;
performing coarse, rapid adaptation to changes in the first signal samples and the second signal samples;
producing first filtered samples corresponding to the first signal samples and second filtered samples corresponding to the second signal samples;
performing second stage filtering at a second stage filter of the MISO circuit, including:
receiving the first filtered samples and the second filtered samples;
performing fine-grain, slow adaptation to changes in the first filtered samples and the second filtered samples;
producing third filtered samples corresponding to the first filtered samples;
producing fourth filtered samples corresponding to the second filtered samples; and
combining the third filtered samples and the fourth filtered samples to produce the filtered sample output.

19. The method of claim 18 further comprising:
combining the first filtered samples and the second filtered samples at the first stage filter to produce a combined first filter output;
determining a sequence of bits based on the combined first filter output at a detector of the MISO circuit; and
adapting coefficient values applied to signal samples at the first stage filter and the second stage filter based on the sequence of bits.

20. The method of claim 18 further comprising:
performing the first stage filtering at the first stage filter using a first number of taps, wherein taps correspond to a number of sample input values considered in adapting to changes in a sample stream; and
performing the second stage filtering at the second stage filter using a second number taps greater than the first number of taps.

* * * * *